United States Patent [19]
Lee

[11] Patent Number: 5,665,423
[45] Date of Patent: *Sep. 9, 1997

[54] METHOD FOR MANUFACTURING A PHOTODETECTOR FOR SENSING LIGHT HAVING A WAVELENGTH WITHIN A WIDE RANGE

[75] Inventor: Ming-Kwei Lee, Kaouhsiung, Taiwan

[73] Assignee: National Science Council, Taipei, Taiwan

[*] Notice: The term of this patent shall not extend beyond the expiration date of Pat. No. 5,478,757.

[21] Appl. No.: 386,960

[22] Filed: Feb. 10, 1995

[51] Int. Cl.$^6$ .............................. B05D 5/12; H01L 31/18
[52] U.S. Cl. .................. 438/88; 427/125; 427/307; 427/344; 427/397.7; 438/98; 438/960
[58] Field of Search .................... 427/74, 123, 125, 427/209, 307, 334, 344, 372.2, 397.7, 250, 255; 437/2, 230, 235; 156/625

[56] References Cited

U.S. PATENT DOCUMENTS

| | | | |
|---|---|---|---|
| 4,522,663 | 6/1985 | Ovshinsky et al. | 148/403 |
| 4,663,188 | 5/1987 | Kane | 427/74 |
| 5,374,581 | 12/1994 | Ichikawa et al. | 437/62 |
| 5,478,757 | 12/1995 | Lee | 437/2 |

*Primary Examiner*—Shrive Beck
*Assistant Examiner*—Brian K. Talbot
*Attorney, Agent, or Firm*—Christie, Parker & Hale, LLP

[57] ABSTRACT

The present invention is related to a method for manufacturing a photodetector which comprises the steps of: (a) preparing a substrate having a back surface; (b) applying a first conducting layer on the back surface; (c) annealing the substrate coated with the first conducting layer in an inert gas atmosphere; (d) applying a anti-corrosion layer on the first conducting layer; (e) immersing the anti-corrosion layer-applied substrate in a hydrofluoric acid aqueous solution with a concentration of 5%~10%; (f) eroding the anti-corrosion layer-applied substrate under a current density of about 12.5~25 mA/cm$^2$ for about 5~40 minutes to obtain a porous layer therereon; and (g) applying a thin film layer of a second conducting layer to an upper surface of the porous layer to obtain the photodetector. The present photodetector has a wider frequency band and a higher sensitivity than conventional ones and the present manufacturing method is simple and economical.

22 Claims, 5 Drawing Sheets

METHOD FOR MANUFACTURING A PHOTODETECTOR FOR SENSING LIGHT HAVING A WAVELENGTH WITHIN A WIDE RANGE

FIELD OF THE INVENTION

This invention relates to a method for manufacturing a photodetector, and more particularly to a method for manufacturing a high sensitivity and wide band porous silicon photodetector.

BACKGROUND OF THE INVENTION

A photodetector is a device converting a photo signal into an electronic signal and extensively used in various field, e.g. communication, computer engineering, controlling engineering and medical engineering, etc. However, different photodetectors are needed for different uses, and also are needed to be adapted according to the requirements of different photo signal frequencies. The detectable frequency band of conventional photodetectors is so narrow that a required photo response cannot be obtained when they are applied to a case needing a wide band or a frequency near the cut-off frequency of the used photodetector. This defect can be obviated by parallel connection of photodetectors with compensating frequency ranges.

The frequency range of a photodetector depends on the semiconductor material it uses. For example, silicon is used in a photodetector having a frequency range of 0.8~0.9 μm, and a Ge, InGaAs or InGaAsP is used in a photodetector having a detectable frequency range of 1.0~1.6 μm, etc. The reason why a photodetector using a specific semiconductor material detects specific frequency is that a semiconductor material with a specific band gap accepts a specific frequency band. Therefore, if a certain frequency or wavelength is needed, a photodetector with a certain semiconductor material is used; and if a wide frequency range is needed, several photodetectors with different semiconductor materials are used.

The shortcomings of the conventional photodetectors include the lack of flexibility in circuitry, assembly and application, and having troubles in the match among the voltage, frequency and circuit.

If a photodetector is able to sense light having a wavelength within a wide range, the inconvenience and high cost caused by using several different semiconductors to achieve the purpose will be reduced. Of course, the wider the wavelength range, the broader the application of the photodetector.

SUMMARY OF THE INVENTION

An objective of the present invention is to offer a simple and economical method to manufacture a photodetector.

Another objective of the present invention is to offer a method to manufacture a photodetector having a direct band gap and thus high opto-electronic conversion efficiency.

Another objective of the present invention is to offer a method to manufacture a photodetector having a wide frequency range.

Another objective of the present invention is to offer a method to manufacture a photodetector having a high photo sensitivity in the wavelength range of 300~1700 nm.

In accordance with the present invention, a method for manufacturing a photodetector for sensing light having a wavelength within a wide range comprises the steps of: (a) preparing a substrate having a back surface; (b) applying a first conducting layer on the back surface; (c) annealing the substrate applied with the first conducting layer in an inert gas atmosphere, e.g. nitrogen atmosphere; (d) applying an anti-corrosion layer on the first conducting layer; (e) immersing said anti-corrosion layer-applied substrate in a hydrofluoric acid aqueous solution with a concentration over 5%, preferably 5%~10%; (f) eroding the anti-corrosion layer-applied substrate under a current density over 5 mA/cm$^2$, preferably 12.5~25 mA/cm$^2$ for about 5~40 minutes, to obtain a porous layer therereon; and (g) applying a thin film layer of a second conducting layer onto an upper surface of the porous layer to obtain the photodetector. The wavelength is in the range from 300 nm to 1700 nm.

In accordance with another aspect of the present invention, the substrate may be made of Si, Ge or SiGe, and the substrate is preferably P type. In the present invention, the substrate serves as an anode. The substrate preferably has a resistivity of about 25~45 Ωcm, and the crystal direction of the substrate is preferably (100).

In accordance with another aspect of the present invention, step (b) is executed by thermal evaporation, and the first conducting layer is preferably made of aluminum.

In accordance with another aspect of the present invention, step (c) is executed at about 350° C.~550° C. for about 10 minutes.

In accordance with another aspect of the present invention, step (d) is executed by coating, and the anti-errosion layer is preferably made of black wax.

In accordance with another aspect of the present invention, wire sizes of the porous layer are different and have a difference ranged within ±30%.

In accordance with another aspect of the present invention, step (f) is excuted by etching.

In accordance with another aspect of the present invention, step (g) is executed by thermal evaporation, and the second conducting layer is preferably made of gold or aluminum.

In accordance with another aspect of the present invention, a step of depriving the anti-corrosion layer following steps (f) or (g) is excuted.

The present invention may best be understood through the following description with reference to the accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purpose of illustration and description only; it is not intended to be exhaustive or to be limited to the precise form disclosed.

Figure 1:
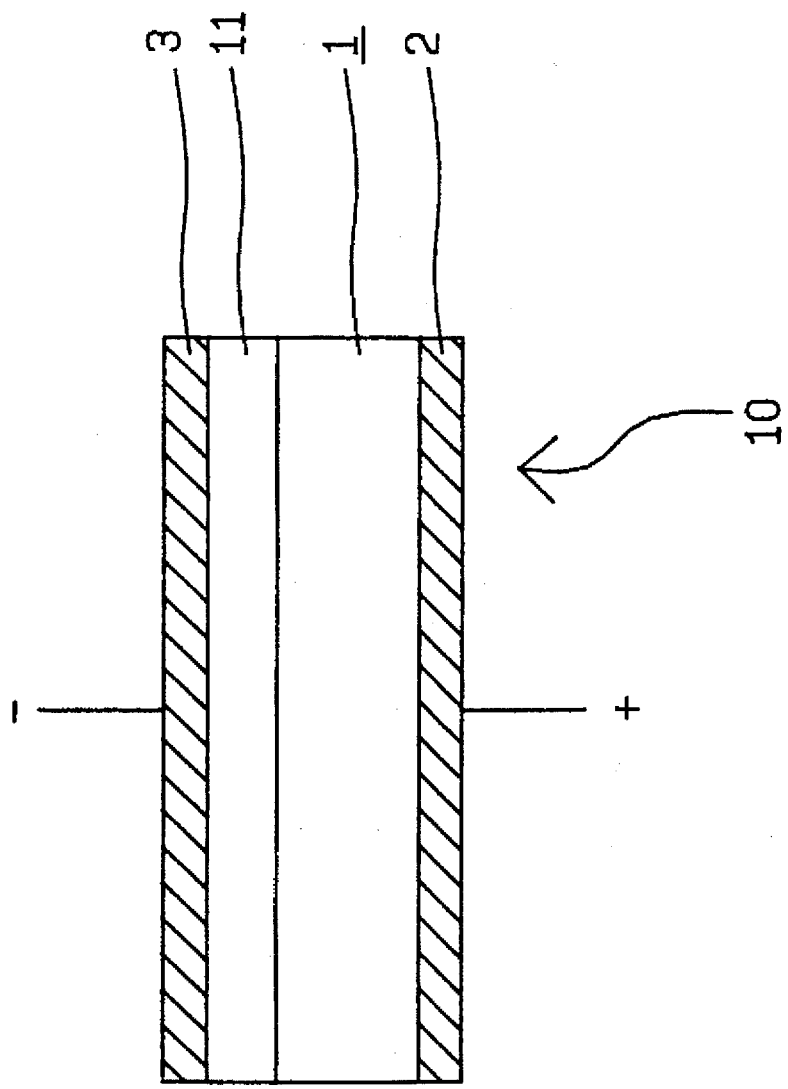
FIG. 1 is a schematic view of a preferred embodiment of a photodetector according to the present invention.

FIG. 1 is a schematic view of a preferred embodiment of a photodetector according to the present invention. The photodetector is a porous silicon photodetector 10 which includes an Si substrate 1, a layer of porous Si 11, a layer of aluminum 2 and a layer of gold 3. The photodetector 10 is manufactured by the following steps:

1. taking a (100) P-type Si having a resistivity of about 25~45 Ω-cm as a substrate 1;
2. providing an aluminum layer 2 to the back surface of the Si substrate 1 by thermal evaporation;
3. having the Si substrate 1 with the aluminum layer 2 subjected to an annealing process in a nitrogen atmosphere for about 10 minutes at a temperature of about 350°~550° C. to form ohmic contact between the aluminum layer 2 and the Si substrate 1;
4. coating the resulting product of step 3 with wax and then placing it into a 5%~10% hydrofluoric acid aqueous solution to produce an anode eroding process for about 5~40 minutes, wherein the input current for eroding the Si substrate 1 is kept at a current density of about 12.5~25 mA/cm², to obtain a porous Si layer 11 on the Si substrate 1; and
5. depriving the wax and then providing a thin gold film 3 by thermal evaporation.

By this method, the photodetector 10 is obtained.

An ideal photodetector is one with a semiconductor material which has a wide distribution in band gap, i.e. has a high band gap as well as a low band gap, and has a high sensitivity for various frequencies. A photodetector with widely distributed band gaps has a higher opto-electronic conversion efficiency when detecting various optical signals with both long and short wavelengths.

A porous Si differs from a general Si in the increase of the photo quantum efficiency caused by the conversion from an indirect band gap to a direct band gap after it is etched through an electrolyte. Besides, the porous Si has a certain distribution in wire size, of about +30%, and according to the quantum confinement theory, different wire sizes correspond to different band gaps. Therefore, a porous Si has an advantage of a wide band gap distribution, i.e. it can detect various optical signals in different frequencies or wavelength ranges. Furthermore, owing to the porous characteristic, the primary reflection rate of the porous Si is lower than that of the general Si, and thus the photo sensitivity of the porous Si without adding any anti-reflection film is also higher than that of the general Si without adding any anti-reflection film.

On the other hand, the Si substrate 1 adjacent to the porous silicon layer 11 remains its original energy gap, so a heterojunction is naturally formed between the Si substrate 1 and the porous silicon layer 11. The heterojunction has band edge discontinuity ΔEv of a valence band energy gap and band edge discontinuity ΔEc of a conductive band energy gap, which can be adjusted by adjusting the energy gap of the porous silicon in order that the photodetector can be used for sensing light having different wavelengths. Of course, the energy gap of the porous silicon can be adjusted by adjusting and controlling the resistivity of the silicon substrate, the concentration of the hydrofluoric acid aqueous solution in the anode eroding process, the current density and the eroding time.

Figure 2:
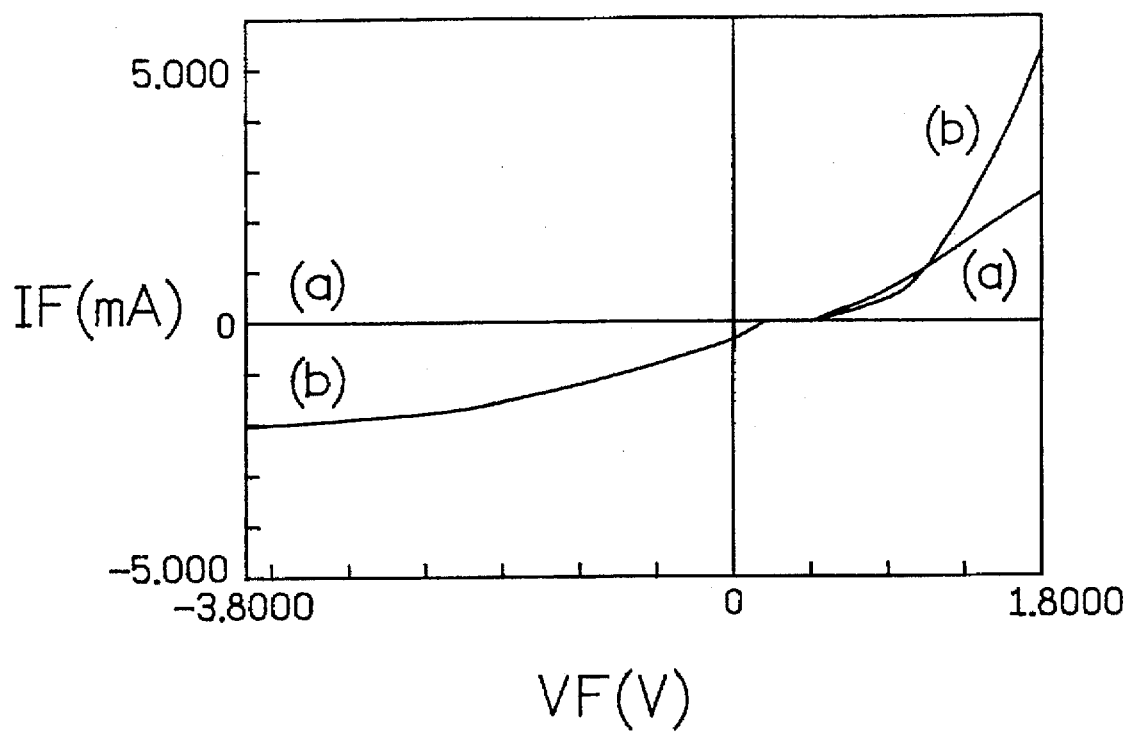
FIG. 2 is voltage vs. current plots of a photodetector respectively under a dark room and an illuminated environment according to the present invention.

FIG. 2 is voltage (VF) vs. current (IF) plots of a photodetector respectively under a dark room and an illuminated environment according to the present invention. The light source is a tungsten lamp with a power of 100W. In this figure, curve (a) represents the result under the dark condition and curve (b) represents the result under the illuminated condition. From this figure, it can be found that the porous silicon photodetector has a good rectifying property. Moreover, the reverse biasing current is strongly responsive to light and the light current is relatively high so that it can be concluded that the present photodetector is quite sensitive.

Figure 3A:
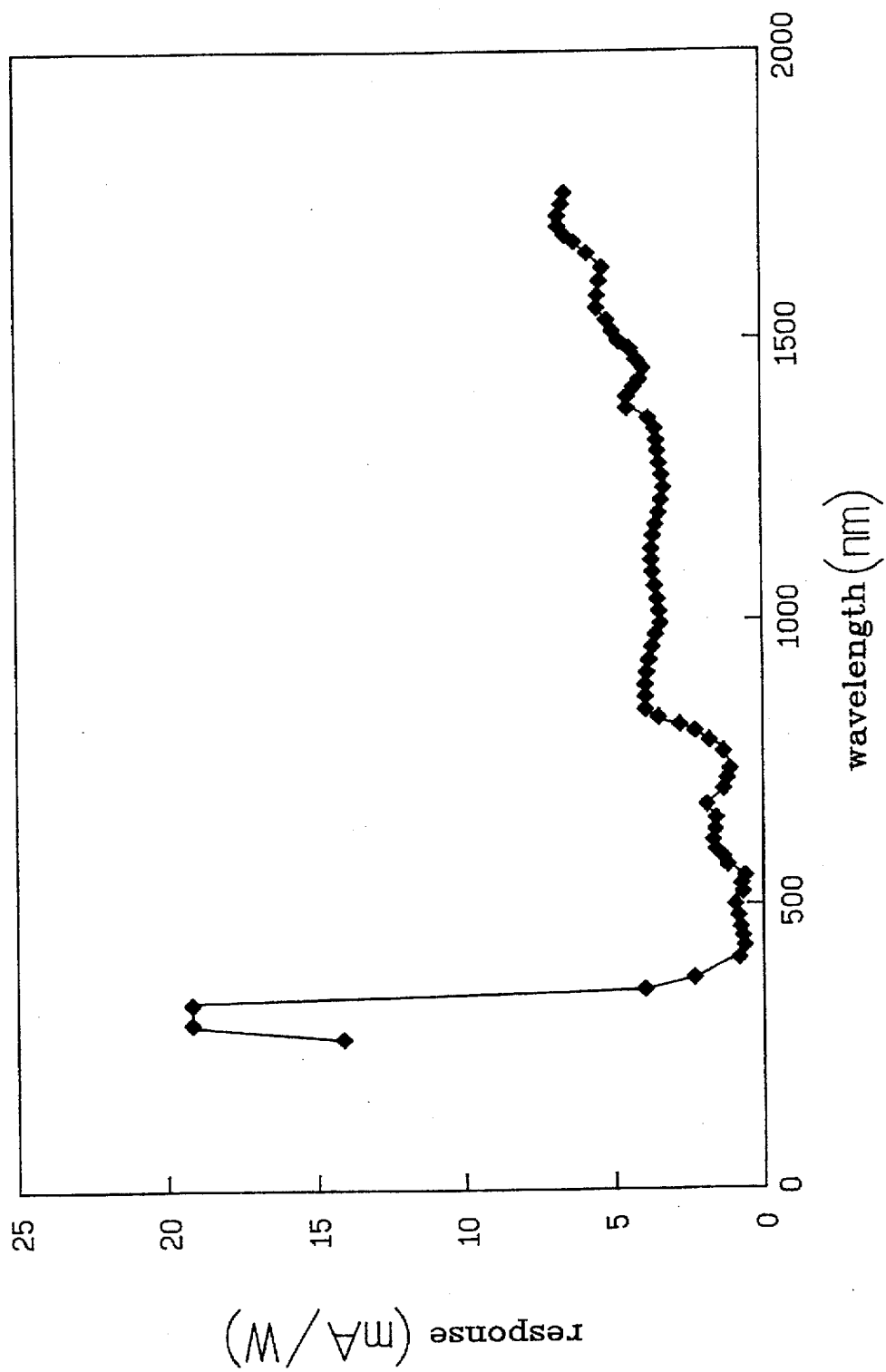
FIG. 3A is a response vs. wavelength plot of a photodetector under an operation voltage of −2 V and detected wavelengths of 300~1700 nm according to the present invention.
Figure 3B:
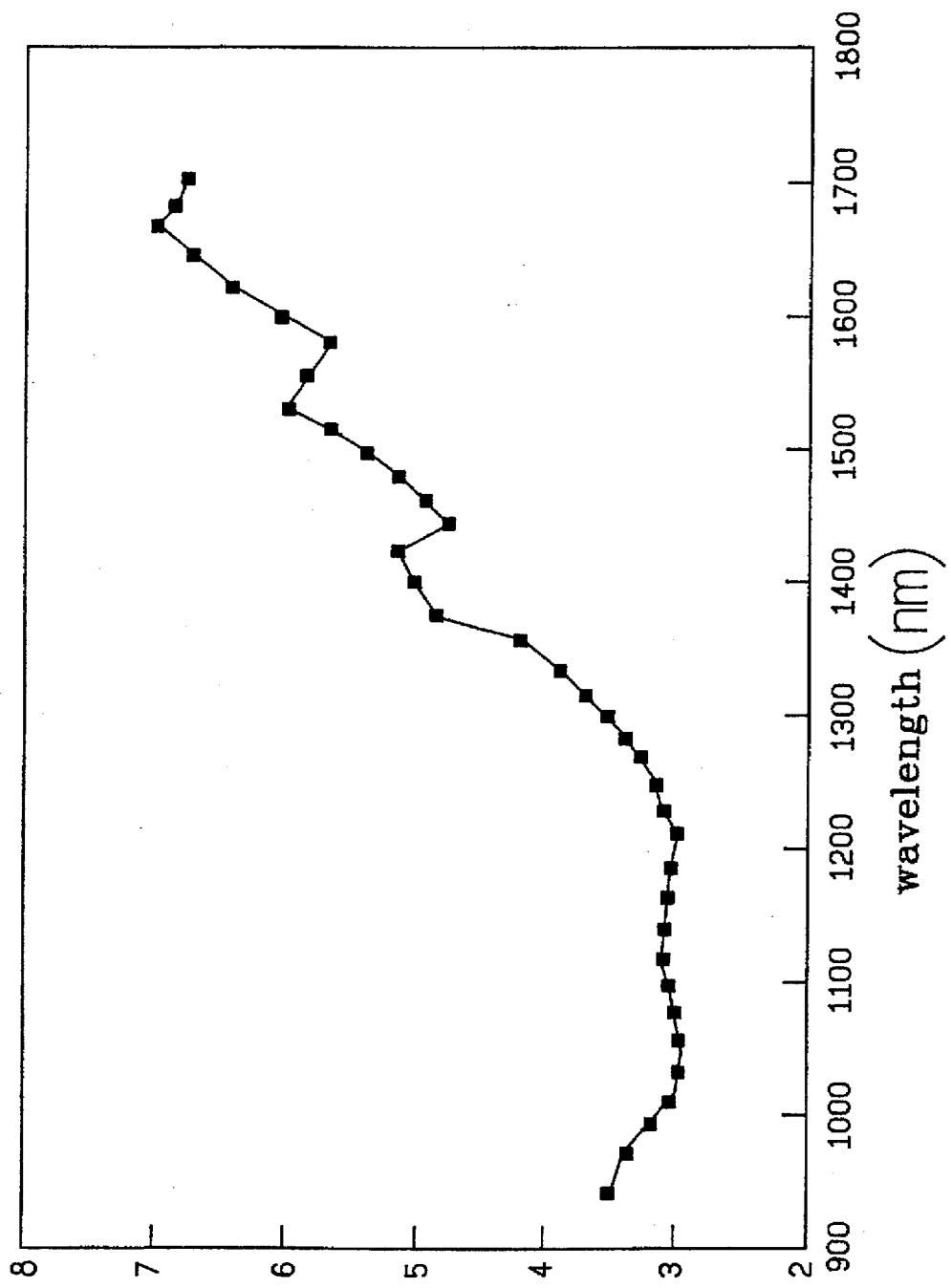
FIG. 3B is a part of the response vs. wavelength plot of the photodetector shown in FIG. 3A.

FIG. 3A is a response vs. wavelength plot of a photodetector under an operation voltage of −2 V and detected wavelengths of 300~1700 nm according to the present invention and FIG. 3B is part of the response vs. wavelength plot of the photodetector shown in FIG. 3A. From the data, it can be seen that the present photodetector has a high sensitivity for all the wavelength range of 300~1700 nm. Especially within the wavelength range of 700~1700 nm, the response intensity increases with the value of the wavelength. For example, the response in a wavelength range over 1100 nm, e.g. 1300~1550 nm, is quite intensive. From these figures, it also can be seen that the present invention is able to sense light having a wavelength within a range wider than a wavelength range of light that the conventional photodetector is able to sense.

Figure 4:
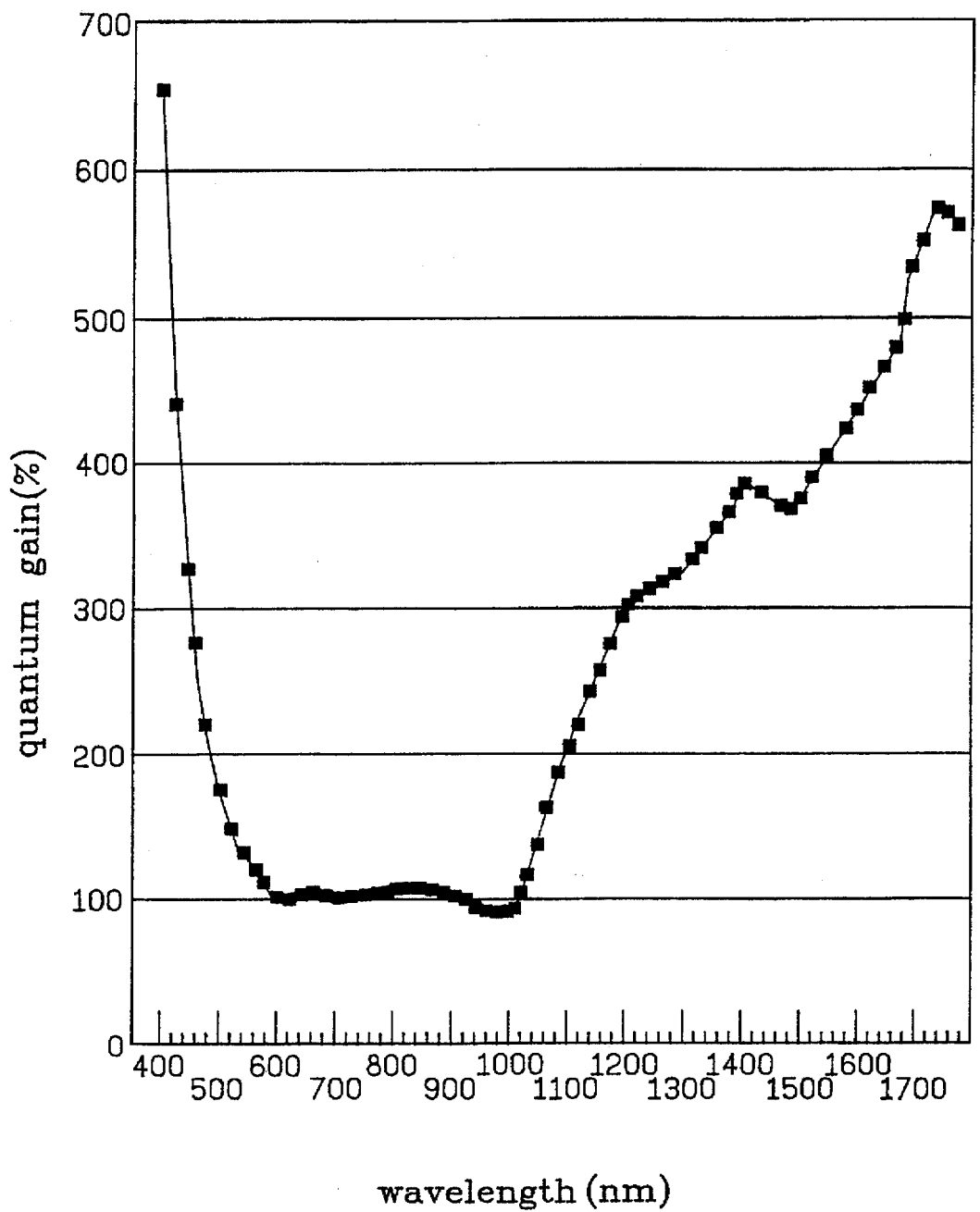
FIG. 4 is a quantum gain vs. wavelength plot of a photodetector according to the present invention.

Referring now to FIG. 4 which is a quantum gain vs. wavelength plot of a photodetector according to the present invention, the system is operated in a reverse biasing voltage of 2 volts. The quantum gain of the photodetector sensing the light having wavelengths between 300 nm and 400 nm is too large to be shown in this figure and thus is omitted. It can be seen from FIG. 4 that the present photodetector has high gain in a wavelength range over 1100 nm. For example, the gain is up to 340% at a wavelength of 1300 nm and up to 470% at a wavelength of 1550 nm. The quantum gain is calculated by the following formula: $\eta=(I_{ph}/q)/(P_{out}/h\nu)$, wherein $I_{ph}$ is light current intensity; $P_{out}$ is power of injection light; q is electron charge; h is Planks constant; and ν is light frequency.

A porous Si is a novel material having a direct band gap. It is produced by eroding a surface of silicon to be porous. The band gap thereof will thus be transformed from an indirect one into a direct one through a folding effect. The band gap is a function of its corresponding wire size and the wire size of the porous Si treated and obtained by the aforementioned procedure has a distribution of +30% around the average wire size so that the distribution of the band gap of the porous Si is wide enough to the extent obtainable by combining together several different semiconductor materials having different band gaps. Moreover, the wire sizes of the porous Si are very fine so that under a complete depletion state, the porous Si can be biassed to generate an avalanche effect in a certain location to amplify the light signal. Therefore, according to the present method, a high gain photodetector can be obtained.

In summary, the advantages of the present porous Si photodetector are described as follows.

1. The raw material and the apparatus for anode eroding are simple and of low cost.
2. The porous photodetector can solve the problem a conventional photodetector encounters in a light-fiber communication system. In a light-fiber communication system, the light having a wavelength ranging within 1300~1550 nm is particularly important because of the property of the light fiber. The present photodetector can serve as many photodetectors respectively used for different wavelength ranges of light and has satisfying response and gain within a wavelength range of 1300~1550 nm under a biasing voltage of only −2 volts. The photodetector serving as a receiving part of the system has to be designated according to the requirement of wavelength range. In general, the photoconductor used for sensing light having a wavelength of 1300 nm is composed of the semiconductor compound InGaAs and the photoconductor used for sensing light having a wavelength of 1550 nm is composed of the semiconductor compound InGaAsP. These materials have smaller energy gaps than silicon has and the photodetectors made of these compounds produce greater noise than those made of silicon. In addition, these materials have complicated structures and the instruments for producing these materials are very expensive so that the photodetectors made of these materials are thus of high cost. Moreover, it is not easy to use the conventional photodetector in the well-developed silicon VLSI technique. On the other hand, an avalanche-photodiode (APD) detector in a light-fiber communication system can communicate for a longer distance than a PIN detector. However, the APD detector needs a high biasing voltage which is different from the biasing voltage the other signal-processing circuits need in order to obtain a high gain.

3. The present photodetector can sense light having a frequency wider than the band width of general silicon although it uses silicon to be its substrate. The photodetector is highly sensitive in a wavelength range of visible light and has an even higher sensitivity in a wavelength range of IR and UV lights. The wavelength range of light the present photodetector can sense is from 300 nm to 1700 nm.

4. The present manufacturing process can be simplied by omitting the step of applying an anti-reflection film. The silicon chip forms a textured surface after being eroded by a current eroding solution. The textured surface is able to strengthen the re-absorption of the primarily reflected light so that it is unnecessary to apply the anti-reflection film to the silicon chip. A conventional photodetector generally has a complicated structure, e.g., Si p-i-n, and the photodetector having highly sensitive heterojunction especially needs an expensive epitaxial system and precise control process. On the contrary, the present method is simple, reliable and cheap.

5. Porous silicon has a high opto-electronic conversion efficiency owing to its direct band gap. High opto-electronic conversion efficiency is benificial to the sensitivity of a photodetector.

6. The present method can be applied with the silicon technique.

7. In the present invention, the manufacturing technique of the opto-electronic integrated circuit is simplified.

8. The operation voltage of the present method is low, e.g., $-2$ volts, but the gain can be up to e.g., 520% at a wavelength of 1650 nm.

9. The present photodetector can sense light having a long wavelength and has a high gain owing to the avalanche effect. For example, the gain is up to 340% at a wavelength of 1300 nm and up to 470% at a wavelength of 1550 nm.

10. The present photodetector can sense light having a long wavelength ranging over 1100 nm, and even over 1700 nm, by only adjusting and controlling the resistivity of the silicon substrate, the concentration of the hydrofluoric acid aqueous solution in the anode eroding process, the current density and the eroding time.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded the broadest interpretation so as to encompass all such modifications and similar structures.

What is claimed is:

1. A method for manufacturing a photodetector for sensing light having a wavelength comprising the steps of:
    (a) preparing a substrate having a back surface;
    (b) applying a first conducting layer on said back surface;
    (c) annealing said substrate applied with said first conducting layer in an inert gas atmosphere;
    (d) applying an anti-corrosion layer on said first conducting layer;
    (e) immersing said anti-corrosion layer-applied substrate in a hydrofluoric acid aqueous solution with a concentration over 5%;
    (f) eroding said substrate under a current density of over 5 milliampere per square centimeter (mA/cm$^2$) to obtain a porous layer thereon; and
    (g) applying a second conducting layer to an upper surface of said porous layer to obtain said photodetector.

2. A method according to claim 1, wherein said wavelength is ranged from 300 nanometers to 1700 nm.

3. A method according to claim 1, wherein said substrate is a material selected from the group consisting of Si, Ge, and SiGe.

4. A method according to claim 1, wherein said substrate serves as an anode.

5. A method according to claim 1, wherein said substrate has a resistivity of about 25 to 45 ohm-centimeter.

6. A method according to claim 1, wherein a crystal direction of said substrate is (100).

7. A method according to claim 1, wherein said step (b) is executed by thermal evaporation.

8. A method according to claim 1, wherein said first conducting layer is made of aluminum.

9. A method according to claim 1, wherein said inert gas is nitrogen.

10. A method according to claim 1, wherein said step (c) is executed at about 350° C. to 550° C.

11. A method according to claim 1, wherein said step (c) is executed for about 10 minutes.

12. A method according to claim 1, wherein said anti-corrosion layer is made of black wax.

13. A method according to claim 1, wherein said porous layer has different wire sizes with a difference ranged within ±30%.

14. A method according to claim 1, wherein said second conducting layer is made of gold.

15. A method according to claim 1, wherein said second conducting layer is made of aluminum.

16. A method according to claim 1, wherein said hydrofluoric acid aqueous solution is in a concentration of 5% to 10%.

17. A method according to claim 1, wherein said step (f) is executed by etching.

18. A method according to claim 17, wherein said step (f) is executed under a current density of about 12.5 to 25 mA/cm$^2$.

19. A method according to claim 18, wherein said step (f) is executed for about 5–40 minutes.

20. A method according to claim 1, wherein said step (g) is executed by thermal evaporation.

21. A method according to claim 1, further comprising a step of removing said anti-corrosion layer following said step (f).

22. A method according to claim 1, further comprising a step of removing said anti-corrosion layer following said step (g).

* * * * *

UNITED STATES PATENT AND TRADEMARK OFFICE
CERTIFICATE OF CORRECTION

PATENT NO. : 5,665,423
DATED : September 9, 1997
INVENTOR(S) : Ming-Kwei Lee

It is certified that error appears in the above-indentified patent and that said Letters Patent is hereby corrected as shown below:

Column 1, line 7, after "relates" insert -- generally --.
Column 1, line 15, change "field" to -- fields --.
Column 3, line 33, change "+30%" to -- ±30% --.
Column 4, line 34, Change "+30%" to -- ±30% --.
Column 5, line 29, change "benificial" to -- beneficial --.

Signed and Sealed this

Fourth Day of August, 1998

*Attest:*

BRUCE LEHMAN

*Attesting Officer*  *Commissioner of Patents and Trademarks*